US007429875B2

United States Patent
Fenstermaker et al.

(10) Patent No.: US 7,429,875 B2
(45) Date of Patent: Sep. 30, 2008

(54) LOW STATIC CURRENT DRAIN LOGIC CIRCUIT

(75) Inventors: Larry R. Fenstermaker, Nazareth, PA (US); Harold Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/638,156

(22) Filed: Dec. 13, 2006

(65) Prior Publication Data

US 2008/0143380 A1    Jun. 19, 2008

(51) Int. Cl.
*H03K 19/094* (2006.01)
(52) U.S. Cl. .............................. 326/81; 326/68; 326/80
(58) Field of Classification Search ................ 326/68, 326/80, 81; 327/333
See application file for complete search history.

(56) References Cited

U.S. PATENT DOCUMENTS

| | | | | |
|---|---|---|---|---|
| 4,506,164 A | * | 3/1985 | Higuchi | 326/81 |
| 5,151,616 A | * | 9/1992 | Komuro | 326/121 |
| 5,671,234 A | * | 9/1997 | Phillips et al. | 714/726 |
| 5,781,497 A | * | 7/1998 | Patel et al. | 365/230.06 |
| 6,262,599 B1 | | 7/2001 | Coughlin, Jr. et al. | 326/81 |
| 6,281,706 B1 | | 8/2001 | Wert et al. | 326/83 |
| 6,335,637 B1 | | 1/2002 | Correale, Jr. et al. | 326/80 |
| 6,529,045 B2 | | 3/2003 | Ye et al. | 326/95 |
| 6,731,134 B1 | | 5/2004 | Bucossi et al. | 326/56 |
| 6,867,615 B1 | | 3/2005 | Plants et al. | 326/40 |
| 6,952,118 B2 | | 10/2005 | Jamshidi et al. | 326/98 |

OTHER PUBLICATIONS

U.S. Appl. No. 11/012,550, filed Dec. 15, 2004.

* cited by examiner

*Primary Examiner*—Anh Q Tran
(74) *Attorney, Agent, or Firm*—Mendelsohn & Associates, PC; Steve Mendelsohn

(57) ABSTRACT

A logic circuit is disclosed that is tolerant of logic signals with voltages different from the voltage of the logic circuit power supply. In one embodiment, the logic circuit has an inverting amplifier therein, the amplifier having at least one input and an output and is powered by the power supply. A first transistor, in responsive to the output of the amplifier, biases the input of the amplifier to assure substantially no static current flows through the amplifier when a logic-low is present on the amplifier output. A second transistor couples at least one logic input of the logic circuit to the input of the amplifier. In one embodiment, the second transistor impedes static current flow from the first transistor, through the second transistor, to the logic input. Various other embodiments of the logic circuit include a latch/flip-flop, multiplexer, and a complex logic gate.

20 Claims, 3 Drawing Sheets

LOW STATIC CURRENT DRAIN LOGIC CIRCUIT

TECHNICAL FIELD

The present invention relates to programmable logic devices, such as field-programmable gate arrays (FPGAs), and, in particular, to the logic circuits and logic gates in such devices.

BACKGROUND

Complicated digital integrated circuits, such as FPGAs, microprocessors, application specific integrated circuits (ASICs), or the like (generally, chips), may have logic circuitry thereon arranged in groups, each group having a common power source. Each group of commonly powered logic circuits is typically referred to as a "power domain" or simply a "domain." Each domain has its own one or more separate power source either on or off the chip.

Having separate power sources for each domain can reduce $I^2R$ loss, noise, and electromigration problems associated with on-chip power buses that carry a relatively large amount of current feeding many thousands of gates. In addition, it may be desirable to have different portions of the chip operate at different voltages to reduce the overall power consumption of the chip, e.g., core logic (programmable logic) may be operated at 1.2 volts or lower while peripheral logic (circuitry that couples the core logic to off-chip circuitry) may operate at 1.5 volts or higher. The core logic and peripheral logic may each have several domains.

Communication between logic circuits in different domains (or between different chips) can be problematic when logic voltage levels are sufficiently different between the domains/chips such that the logic gates in one domain/chip might not completely switch from one state to another state in response to logic signals received from another domain/chip. The resulting static (dc) current flow in the logic gates not completely switching states may lead to excess power consumption in the chip. This scenario is illustrated in FIG. 5.

FIG. 5 shows a conventional inverter 500 being driven by a logic gate 501. As illustrated, the logic gate 500 is in a domain powered from a power source $V_{ccH}$ and inverter 501 is in a domain powered from a power source $V_{ccL}$ (the domains being referred to herein as the $V_{ccH}$ domain and the $V_{ccL}$ domain, respectively, and the different domains may be on the same chip or different chips), resulting in the logic signal from gate 501 at node 502 ranging from approximately 0 volts (ground) to approximately $V_{ccL}$ volts. Normally, the voltages of the $V_{ccL}$ and $V_{ccH}$ domains are substantially the same. Thus, if the logic signal on node 502 is approximately $V_{ccL}$ volts, then the gate and source voltages of transistor 503 are substantially the same, turning off transistor 503 so that essentially no static current flows though it. As is sometimes the case, the voltage of $V_{ccL}$ can be significantly less than the voltage of $V_{ccH}$. For example, if the voltage of the $V_{ccH}$ domain exceeds the voltage of the $V_{ccL}$ domain by the threshold voltage of transistor 503 and the logic signal at node 502 is $V_{ccL}$ volts, then transistor 504 is fully conducting but transistor 503 is not completely turned-off. This results in a static current flow through transistors 503 and 504.

The static current flow problem, discussed above, may also manifest itself as a transient flow problem. For example, it is possible that the voltage of the $V_{ccL}$ domain will vary significantly as the logic gates in the domain switch state, possibly causing the domain voltage to temporarily droop sufficiently to induce static current flow in at least some of the logic gates in the $V_{ccH}$ domain and/or other domains. Since there are possibly thousands of logic gates in a programmable device in each domain, the potential for large static current consumption (and corresponding high power dissipation) in one or more domains is large. Moreover, as transistors get smaller and the operating voltages of the transistors are commensurately reduced, domain voltage tolerances also become considerably tighter to avoid static current flow. The voltage tolerances may eventually become so tight that it becomes impractical to implement large chips with separate power domains or for one chip to communicate with another chip.

One remedy to the above-described problem is illustrated in FIG. 6. As shown, a gate 600 has therein an inverting buffer 601 followed by a NAND gate 602, both of which are powered from the $V_{ccH}$ domain. Gate 600 is driven by two serial-coupled inverters 605, 606 powered from the $V_{ccL}$ domain. The inverters 605, 606 provide complementary logic signals to nodes 607, 608, the inputs to the buffer 601. Buffer 601 consists of transistors 610-613 and an output logic signal from the output 615 of buffer 601 is applied to the NAND gate 602. NAND gate 602, responsive to logic signal input P, is needed to both invert logic signals passing through the buffer 601 as well as disable output signals from buffer 601 from reaching other logic circuits during power-up when logic signals to and from buffer 601 may be unknown or invalid. Transistors 612, 613 are cross-coupled so that, along with transistors 610, 611, the output logic signal on node 615 is stabilized as either a logic-high or logic-low state as determined by the complementary logic signals on nodes 607, 608. Because the logic signals on nodes 607, 608 drive only transistors 610, 611 and not transistors 612, 613, wide variations in voltage difference between $V_{ccL}$ and $V_{ccH}$ can be tolerated. However, this advantage comes at the cost. Among other complications, gate 600 has more circuitry (e.g., transistors 610 and 612, NAND gate 602, and inverter 606) when compared to the simple arrangement in FIG. 6. Moreover, complementary signals are needed to drive buffer 601, potentially doubling the number of connections between gates in different domains or between chips. Additionally, the propagation delay of logic signals through the inverters 605, 606, buffer 601, and gate 602 is longer than through the two simple inverters of FIG. 5, thereby limiting the speed of the chip implementing the circuit in FIG. 6.

It is therefore desirable to provide a high-speed, logic circuit that does not have significant static current drain over a wide range of input logic signal voltage levels. In addition, it is desirable that the logic circuit be able to perform complex logic functions so that it may be used in a wide variety of applications.

SUMMARY

In one embodiment, the present invention is a programmable logic device having at least one input node, an output node, a first node adapted to couple to a first power source, and at least one intermediate node. An amplifier in the device has at least one input coupling to the intermediate node, an output coupling to the output node, and at least one power terminal coupling to the first node. A first transistor has a control terminal coupling to the output node and has two output terminals coupling between the first node and the intermediate node. A second transistor has two output terminals coupling between the input node and the intermediate node.

In another embodiment, the present invention includes the steps of selectively coupling a logic signal on at least one input node to an intermediate node, applying bias to the intermediate node, and amplifying the logic signal on the intermediate node to an output node. The bias is applied in response to the amplified logic signal on the output node.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

DETAILED DESCRIPTION

Figure 1:
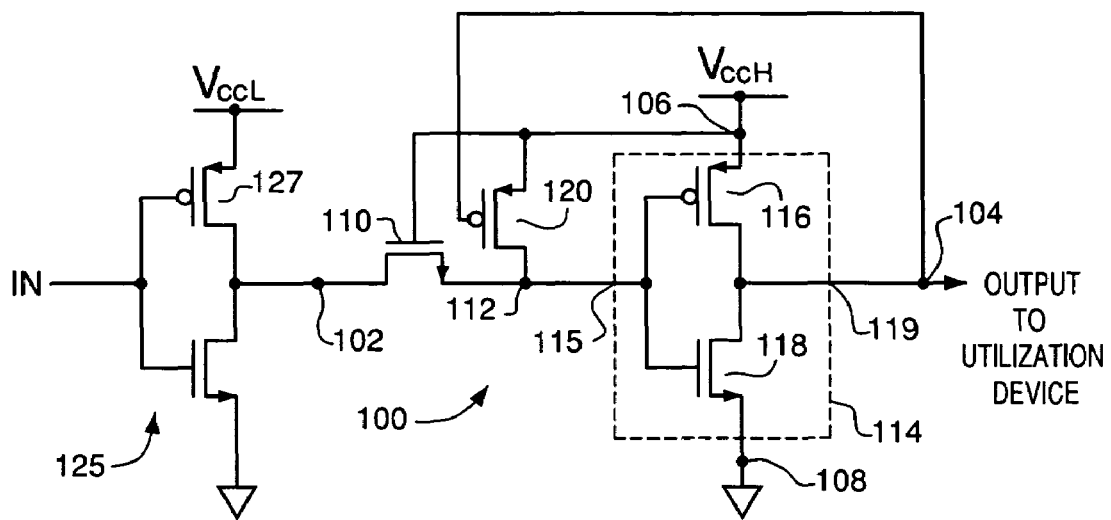
FIG. 1 is a schematic diagram of an improved logic inverter, according to one embodiment of the present invention.

For purposes of this description and unless explicitly stated otherwise, each numerical value and range should be interpreted as being approximate as if the word "about" or "approximately" preceded the value of the value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected," refer to any manner known in the art or later developed in which energy is allowed to be transferred between two or more elements and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

FIG. 1 is a schematic diagram of an exemplary embodiment of the invention. An improved logic circuit (gate) 100, an inverter in this embodiment, has an input node 102, an output node 104, and power source nodes 106, 108 coupling to domain power source $V_{ccH}$ and ground, respectively.

As will be discussed in more detail below, transistor 110, an n-channel MOSFET in this embodiment, selectively couples logic signals from the input node 102 to an intermediate node 112. As shown, the source of transistor 110 couples to node 112 and the drain couples to input node 102. For this embodiment, the control terminal, or gate, of the transistor 110 is coupled to the power source node 106. However, the control terminal may be advantageously coupled to other sources of control signals, as will be demonstrated in other embodiments of the invention.

Amplifier 114, in this embodiment as a conventional CMOS inverter, amplifies signals on node 112 to output node 104. Operationally, amplifier 114 produces a logic-high output signal on output 119 if the voltage on input 115 is less than a switch-point voltage of the amplifier 114, typically about one-half the power source voltage, here $V_{ccH}/2$ volts. Conversely, if the input voltage on input 115 is greater than the switch-point voltage, then the amplifier 114 produces a logic-low on output 119. Because the source of p-channel transistor 116 couples to node 106, the source of n-channel transistor 118 couples to node 108, and the drains of both transistors couple to the output node 104 via output 119, logic signals on output node 104 range from about ground (0 volts) to about $V_{ccH}$ volts. It is understood by those with ordinary skill in the art that the voltages on nodes 106, 108, and the resulting voltages on the output node 104, may be any desired voltage other than the examples shown.

Transistor 120, a p-channel MOSFET in this embodiment, pulls the voltage on node 112 up to approximately $V_{ccH}$ volts by providing a bias to the node 112 depending on the logic signals on output node 104. The source of the transistor 120 is coupled to the power source node 106 and the drain of transistor 120 is coupled to the node 112. The control node (gate) of transistor 120 is coupled to the output node 104 for receiving logic signals thereon. As will be explained in more detail below, the current provided or passed by transistor 120 is chosen to provide enough current (over all processing, temperature, and power source voltage variations) to node 112 so that the voltage thereon is approximately the voltage of node 106 (here, $V_{ccH}$) if node 104 is at logic-low, thereby turning transistor 116 fully off. However the amount of current should not be so high that transistor 110 is unable to pull the voltage of node 112 low enough to switch amplifier 114 as node 102 is pulled from a logic-high to a logic-low (as will be described below, this is a transient issue since transistor 120 is turned-off after the voltage on node 112 goes sufficiently low for amplifier 114 to switch its output to a logic-high).

Operation of the improved logic circuit 100 is illustrated herein by conventional logic gate 125 driving the input node 102 with logic signals ranging from approximately ground potential or 0 volts (a logic-low) to approximately $V_{ccL}$ volts (a logic-high). (For simplicity in the following examples and unless otherwise noted, the threshold voltages of all the transistors (both n- and p-channel) are assumed to be the same except that the polarity of the threshold voltage for p-channel transistors is opposite that for n-channel transistors and that $V_{ccL} = V_{ccH}$.) In a first operational example and beginning with a logic-low on node 102, transistor 110 is turned-on and it holds the voltage on node 112 to less than the switch-point voltage of the amplifier 114 so that amplifier 114 applies to output node 104 a logic-high signal of approximately $V_{ccH}$ volts. Because the voltages on both the gate and source of transistor 120 are about the same, transistor 120 is turned-off and passes essentially no current.

In a second operational example, as the gate 125 transitions input node 102 from a logic-low to a logic-high, transistor 110 (being already turned-on) pulls the voltage of node 112 up to approximately $V_{ccL}$ volts less approximately the threshold voltage of transistor 110. The voltage on node 112 is now sufficient to turn transistor 118 fully on but might not yet be sufficient to turn transistor 116 fully off, resulting in static current flow though transistors 116 and 118. However, as the voltage on output node 104 is discharged by transistor 118 to a logic-low (approximately 0 volts), the gate of transistor 120 is also pulled low, turning transistor 120 on so that it injects sufficient bias current into node 112 to pull the voltage of node 112 up to approximately $V_{ccH}$ volts. This turns transistor 116 fully off such that substantially no static current flows through transistors 116 and 118. Then, because the drain, source, and gate of transistor 110 are now all at approximately the same voltage, transistor 110 is turned-off.

In a third operational example, as conventional logic gate 125 transitions input node 102 from a logic-high to logic-low, transistor 110 turns on (for purposes here, due to the reciprocal nature of a MOSFET, the source and drain of a MOSFET can be interchanged and if the gate-to-source/drain voltage is greater than the threshold voltage of the MOSFET, the MOSFET conducts) and pulls the voltage on node 112 toward ground. Once the voltage on node 112 is less than the switch-point of the amplifier 114, transistor 118 turns off and transistor 116 turns on, bringing the voltage on the output node 104 to a logic-high of $V_{ccH}$ volts, thereby turning transistor 120 off.

Advantageously, transistor 110, operating in cooperation with transistor 120, selectively couples node 102 to node 112 so that circuit 100 can tolerate substantial variations of the $V_{ccL}$ domain voltage with respect to the $V_{ccH}$ domain voltage without substantial static current flow. However, it may be desirable to restrict the range of voltages that $V_{ccL}$ can take on to avoid static current flow between the $V_{ccH}$ domain and the $V_{ccL}$ domain through transistors 110, 120, and 127. This undesirable static current flow will occur because transistor 110 will be turned-on if the voltage on node 102 is a threshold voltage or more lower or higher than the voltage of $V_{ccH}$ while transistor 120 is turned-on. For example, if the logic-high voltage on node 102 is 0.7 volts and $V_{ccH}$ is 1.2 volts, then the gate-to-source/drain voltage of transistor 110 is 0.5 volts which, if greater than the threshold voltage of transistor 110, biases transistor 110 into conduction. Biasing transistor 110 into continuous (static) conduction may be avoided by restricting the logic-high voltage on node 102 (as determined by $V_{ccL}$ with the embodiment shown for gate 125), with respect to $V_{ccH}$, such that transistor 110 remains turned-off except during normal logic signal transitions on node 102. Thus, it is advantageous to restrict the voltage difference between $V_{ccL}$ and $V_{ccH}$ to less than about a threshold voltage. By doing so, transistor 110 will selectively couple node 102 to node 112 if there is sufficient gate-to-source/drain voltage to turn transistor 110 on (e.g., during logic signal transitions on node 102), thereby avoiding static current flow through transistor 110.

Advantageously, the voltage of $V_{ccL}$ may exceed the above-mentioned voltage restriction up to the breakdown voltages of the various transistors but at the cost of the above-mentioned static current flow through transistors 110, 120, and 127 (in this case and for purposes here, transistor 120 will be turned-on and will act as a clamp to hold the voltage on node 112 to about $V_{ccH}$ volts).

As stated above, the current passed by transistor 120 is chosen to provide enough current (over all processing, temperature, and power source voltage variations) so that 1) the voltage on node 112 is approximately the voltage of node 106 if node 104 is at logic-low, but not so much that 2) transistor 110 is unable to pull the voltage of node 112 low enough to switch amplifier 114 as node 102 is pulled from a logic-high to a logic-low. It is known in the art that the maximum current that a transistor can pass depends on the physical size of the transistor. By making the channel width smaller, the amount of current the transistor will pass is proportionally smaller. In addition, the length of the channel may be increased to further limit the current capacity of the transistor. Thus, in a preferred embodiment, transistor 120 is physically smaller than transistor 110 and is typically smaller than all the transistors in the circuit 100, as well the transistors in the gate 125.

In an exemplary 1.2 volt, 65 nm (60 nm gate length) CMOS process, the approximate sizes and threshold voltages of the transistors in circuit 100 are as follows:

| transistor 110 | 570 nm × 60 nm | 0.4 volts |
| transistor 116 | 380 nm × 60 nm | −0.5 volts |
| transistor 118 | 490 nm × 60 nm | 0.4 volts |
| transistor 120 | 160 nm × 90 nm | −0.5 volts |

The resulting circuit 100 with a $V_{ccH}$ domain voltage of 1.2 volts allows for a $V_{ccL}$ domain voltage of as low as 0.8 volts and as high as 1.6 volts with no substantial static current flow in the circuit 100 or static current flow between the $V_{ccH}$ and $V_{ccL}$ domains through the transistor 110. Thus, the circuit 100 may be used in both core logic circuitry and peripheral logic circuitry, discussed above, where, for example, the core logic operates with a domain voltage of 1.2 volts and the peripheral logic operates at a domain voltage of 1.5 volts.

For purposes here, the amplifier 114, while shown as a CMOS inverter, comprises any circuit that includes an active device (such as a transistor) that amplifies. Examples of an amplifier include, but are not limited to, buffers, inverters, gates, operational amplifiers, etc.

Figure 2:
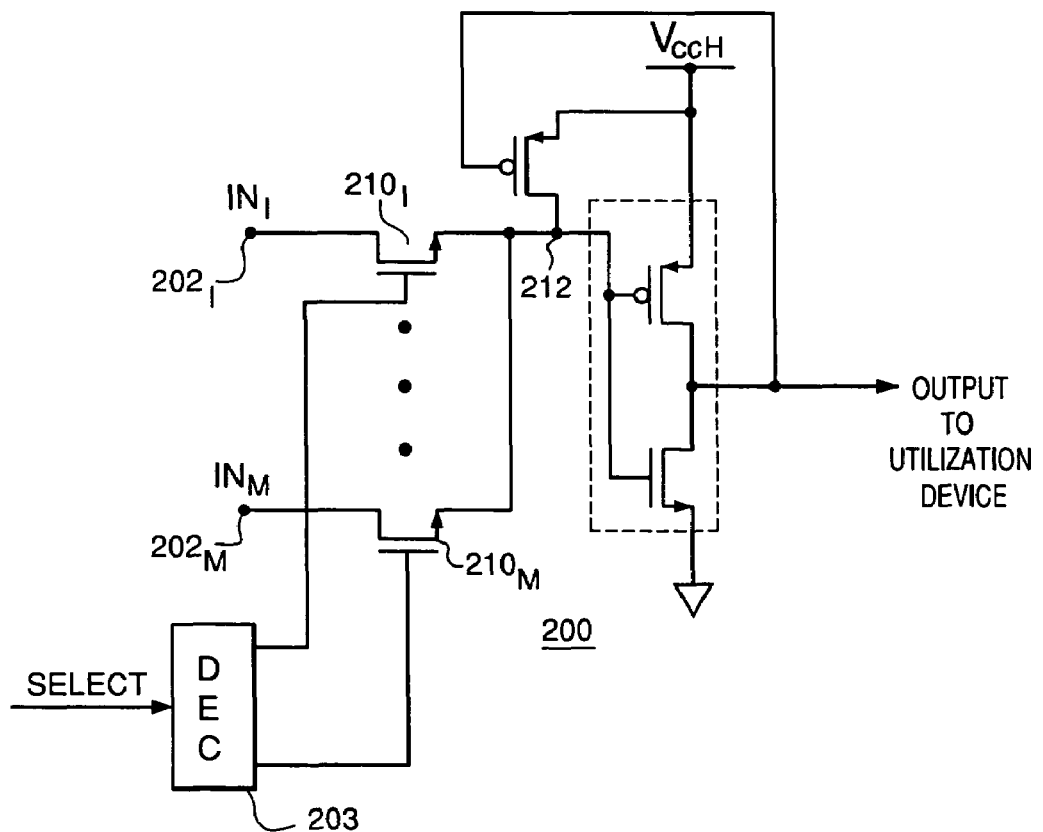
FIG. 2 is a schematic diagram of an improved logic multiplexer, according to another embodiment of the present invention.

Another embodiment of the invention is shown in FIG. 2, where the inverter of FIG. 1 is configured as a multiplexer. The multiplexer 200 is similar in configuration and operation to the inverter of FIG. 1, except that transistor 110 (FIG. 1) is replicated for each input node $202_1$-$202_M$, and the gate of each replicated transistor $210_1$-$210_M$ is controlled by a decoder 203, preferably part of the power domain $V_{ccH}$. Decoder 203, as determined by the input signal SELECT, outputs a logic-high signal on only one of the M outputs thereof and, thus, to one of the gates of corresponding transistors $210_1$-$210_M$ to selectively enable one of the transistors $210_1$-$210_M$. The enabled one of the transistors $210_1$-$210_M$ couples a logic signal (from other logic gates in the $V_{ccH}$ domain or from logic gates in another domain, such as the $V_{ccL}$ domain in FIG. 1) on the corresponding input nodes $202_1$-$202_M$ to node 212.

Figure 3:
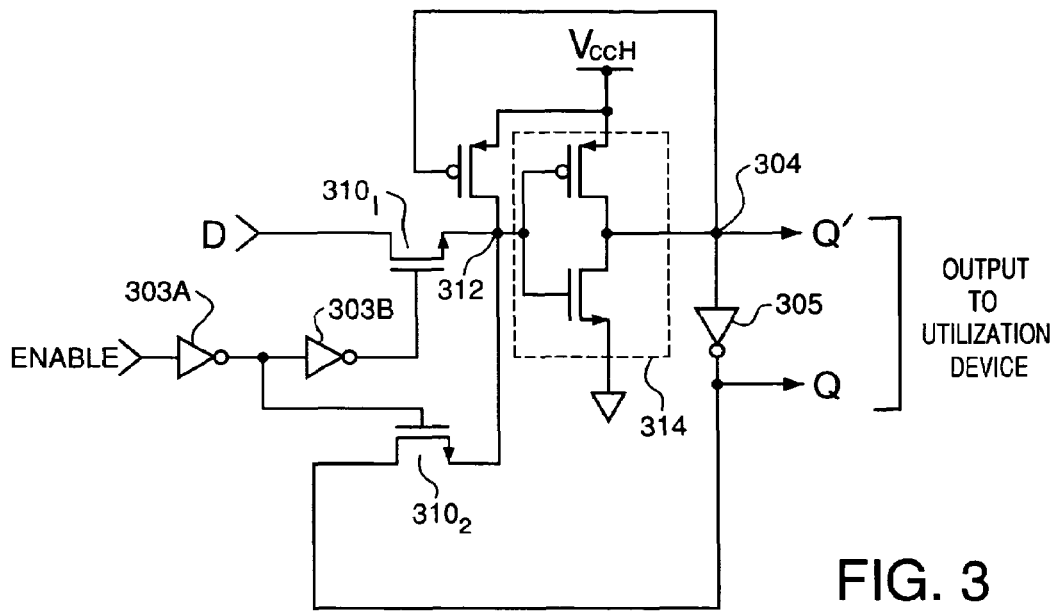
FIG. 3 is a schematic diagram of an improved transparent data latch or flip-flop, according to another embodiment of the present invention.

An additional embodiment of the invention is shown in FIG. 3 as part of a transparent data latch, also known in the art as a D-type latch with a clock enable. This latch is similar to a two-input multiplexer (M=2) of the type of multiplexer 200 shown in FIG. 2, except that one input to the multiplexer receives an inverted logic value of the logic signal on the output node 304. If ENABLE input is high, then transistor $310_1$ passes logic signals from input D (the logic signals may originate from logic gates in another domain, such as the $V_{ccL}$ domain in FIG. 1) to the node 312 which is, in turn, amplified by inverting amplifier 314 such that the logic signal Q' on node 304 is the logical inverse of the logic signal on input D. Corresponding output Q from inverter 305 is logically the same as the logic signal on input D. Upon the ENABLE signal going low, the state of outputs Q and Q' are held to the logic value existing thereon as transistor $310_1$ is disabled, decoupling the D input from node 312, and transistor $310_2$ is enabled, coupling the output of inverter 305 to node 312, thereby holding the logic value for so long as the ENABLE signal is held low. While it is preferable that conventional CMOS inverters 303A, 303B, and 305 are part of the $V_{ccH}$ domain, inverter 305 may be part of another power domain, such as $V_{ccL}$. If the source of the ENABLE signal is from a logic gate in another domain, such as the $V_{ccL}$ domain in FIG. 1, then the inverter 303A may be of the type shown in FIG. 1 whereas inverter 303B may be a conventional CMOS inverter.

It is understood by those skilled in the art that the D-type latch of FIG. 3 may be configured as part of an edge-triggered flip-flop, such as a J-K-, R-S-, D-, or T-type flip-flop.

Figure 4:
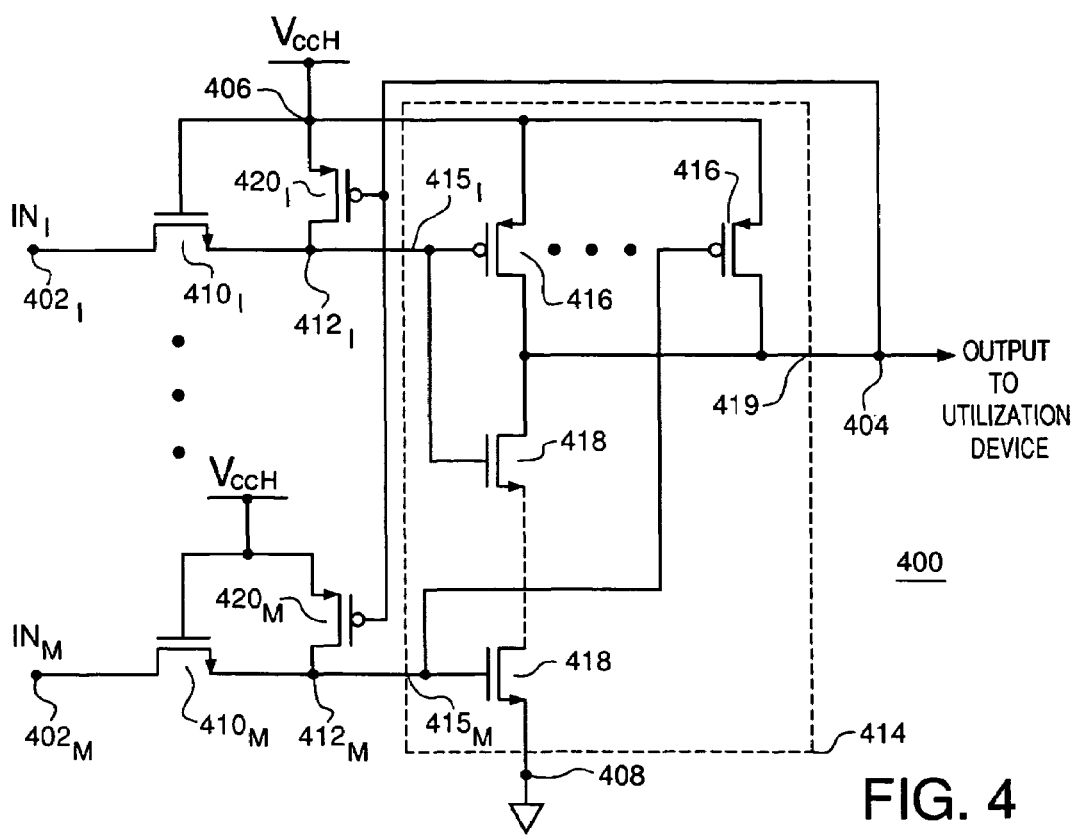
FIG. 4 is a schematic diagram of an improved NAND gate, according to another embodiment of the present invention.
Figure 5:
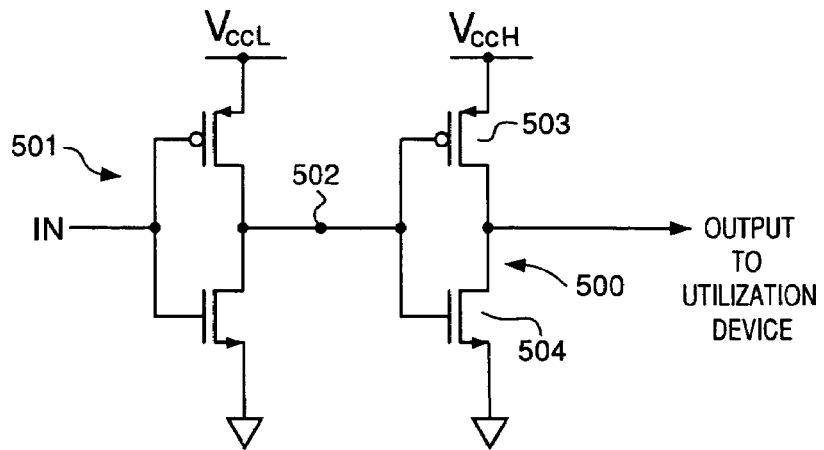
FIG. 5 is a schematic diagram of a prior art logic inverter being driven by a logic gate, the inverter and logic gate being powered by two different power sources; and, FIG. 6 is a schematic diagram of a prior-art logic gate.
Figure 6:
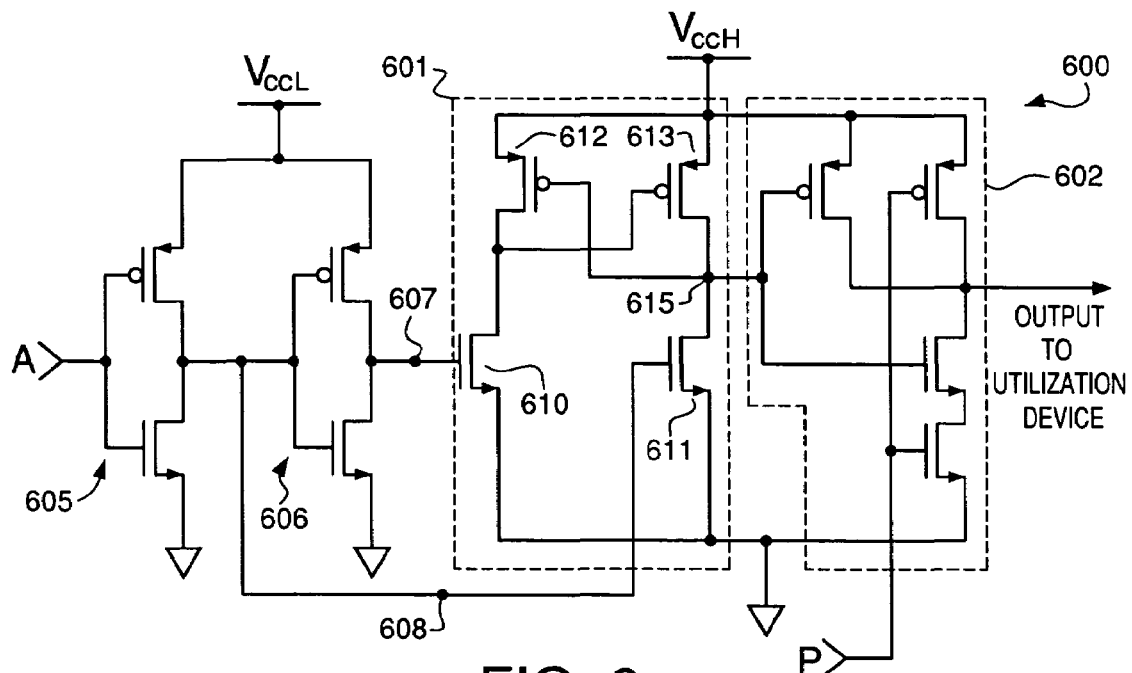

FIG. 4 illustrates the invention in an embodiment for performing a complex logic function, here a NAND (negative AND) logic function. Configuration and operation (described below) of this embodiment is similar to that shown in FIG. 1. One difference between the two embodiments is that the amplifier 414 in FIG. 4 is a conventional CMOS NAND gate instead of a CMOS inverter 114 as shown in FIG. 1.

Referring to FIG. 4, the gate 400 has multiple inputs $402_1$-$402_M$ coupled to corresponding intermediate nodes $412_1$-$412_M$ via corresponding pass transistors $410_1$-$410_M$ having the gates thereof coupled to the power node 406. Transistors $420_1$-$420_M$ are configured to selectively bias corresponding intermediate nodes $412_1$-$412_M$ in response to the output logic signal on node 404, as described above in the description of FIG. 1. Amplifier 414, powered from nodes 406, 408, has M inputs $415_1$-$415_M$ coupling to corresponding intermediate nodes $412_1$-$412_M$ and an output 419 coupling to the output node 404. The amplifier 414, here a conventional CMOS NAND gate and well known in the art, has multiple transistors (416, 418) therein interconnected to provide a logical NAND function to logic signals applied to the M inputs thereof. Transistors $420'$-$420_M$ assure that the voltages on intermediate nodes $412_1$-$412_M$ are sufficiently close to the voltage on node 406 ($V_{ccH}$) that the p-channel transistors 416 in the amplifier 414 are turned-off when the output of the amplifier 414 is a logic-low.

It is understood that the amplifier 414 may be a NOR (negative OR) gate instead of a NAND gate but with the attendant possibility of static current from one or more transistors $420_1$-$420_M$ may be passed through corresponding transistors $410_1$-$410_M$ if not all of the logic signals on inputs $402_1$-$402_M$ are logic-low. It is also understood that amplifier 414 may be a combination of NAND and NOR functions to yield an even more complex logic function, such as an AND-OR-invert gate. Further, in some situations, not all the transistors $420_1$-$420_M$, and corresponding transistors $410_1$-$410_M$, are needed. For example, if input $402_1$ ($1 \leq I \leq M$) to gate 400 is driven by a logic gate in the same domain as the gate 400, the corresponding transistors $420_1$, $410_1$ may be eliminated and the corresponding input $415_1$ of amplifier 414 may be wired directly to the input $402_1$.

Although the present invention has been described in the context of FPGAs, those skilled in the art will understand that the present invention can be implemented in the context of other types of programmable logic devices (PLDs), such as, without limitation, application specific integrated circuits (ASICs), mask-programmable gate arrays (MPGAs), simple programmable logic device (SPLDs), complex programmable logic devices (CPLDs), digital signal processors (DSPs), and microprocessors. More generally, the present invention can be implemented in the context of any kind of electronic device having logic elements.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A programmable logic device comprising:
   at least one input node;
   an output node;
   a first node adapted to couple to a first power source;
   at least one intermediate node;
   an amplifier having at least one input coupling to the intermediate node, an output coupling to the output node, and at least one power terminal coupling to the first node;
   a first transistor having a control terminal coupling to the output node and having two output terminals coupling between the first node and the intermediate node;
   a second transistor having two output terminals coupling between the input node and the intermediate node;
   an additional transistor having a control terminal and having two output terminals coupling between an additional node and the intermediate node; and
   an inverter having an input coupling to the output node and having an output coupling to the additional node.

2. The device of claim 1, wherein the first and second transistors are MOSFETS of opposite conductivity type and the first transistor has a physical size smaller than that of the second transistor.

3. The device of claim 1, wherein the amplifier comprises:
a third transistor having a control terminal coupling to the input of the amplifier and having two output terminals coupling between a first one of the two power terminals and the output of the amplifier; and
a fourth transistor having a control terminal coupling to the input of the amplifier and having two output terminals coupling between a second node and the output of the amplifier;
wherein the second node is adapted to couple to a second power source.

4. The device of claim 3, wherein the first and third transistors are MOSFETs of a first conductivity type, the second and fourth transistor are MOSFETs of a second conductivity type opposite the first conductivity type, and the first transistor has a physical size smaller than that of the other transistors.

5. The device of claim 1, wherein the second transistor has a control terminal coupling to the first node.

6. The device of claim 1, wherein the amplifier is a CMOS logic gate having at least one additional input coupling to an additional intermediate node.

7. The device of claim 6, wherein the CMOS logic gate is a CMOS NAND or NOR gate.

8. The device of claim 6, further comprising:
a third transistor having a control terminal coupling to the output node and having two output terminals coupling between the first node and the additional intermediate node; and
a fourth transistor having two output terminals coupling between an additional input node and the additional intermediate node;
wherein the second and fourth transistors each have a control terminal, the control terminal of the second transistor coupling to the first node, and the control terminal of the fourth transistor coupling to the first node.

9. The device of claim 1, further comprising:
a decoder having multiple outputs; and
at least one additional transistor having two output terminals coupling between an additional input node and the intermediate node;
wherein the second transistor has a control terminal coupling to an output of the decoder, and the at least one additional transistor has a control terminal coupling to an output of the decoder.

10. The device of claim 1, further comprising:
a control node;
a first inverter having an input coupling to the control node and having an output coupling to the control terminal of the additional transistor; and
a second inverter having an input coupling to the output of the first inverter and having an output;
wherein the second transistor has a control terminal coupling to the output of the second inverter.

11. The device of claim 1, wherein the device is formed in an integrated circuit.

12. A programmable logic device comprising:
at least one input node;
an output node;
a first node adapted to couple to a first power source;
at least one intermediate node;
means for amplifying having at least one input coupling to the intermediate node, an output coupling to the output node, and at least one power terminal coupling to the first node;
means, responsive to the output node, for selectively supplying a bias to the intermediate node;
means for selectively coupling the input node to the intermediate node;
means for selectively coupling an additional node and the intermediate node; and
means for inverting a signal appearing at the output node and for coupling the inverted signal to the intermediate node.

13. The device of claim 12, wherein the means for amplifying comprises an inverting amplifier.

14. The device of claim 12, wherein the means for selectively supplying bias comprises a MOSFET of a first polarity type and the means for selectively coupling comprises a MOSFET of a conductivity type opposite the first conductivity type.

15. The device of claim 12, wherein the means for selectively coupling couples the input node to the intermediate node when a voltage difference between the two nodes exceeds a predetermined voltage.

16. The device of claim 12, further comprising:
means for inverting a control signal applied to a control node, wherein the inverted control signal is applied to a control terminal of the means for selectively coupling the additional node and the intermediate node; and
means for inverting the inverted control signal to generate a twice-inverted control signal, wherein the twice-inverted control signal is applied to a control signal of the means for selectively coupling the input node to the intermediate node.

17. A programmable logic device comprising:
at least one input node;
an output node;
a first node adapted to couple to a first power source;
at least one intermediate node;
an amplifier having at least one input coupling to the intermediate node, an output coupling to the output node, and at least one power terminal coupling to the first node, wherein the amplifier is a CMOS logic gate having at least one additional input coupling to an additional intermediate node;
a first transistor having a control terminal coupling to the output node and having two output terminals coupling between the first node and the intermediate node;
a second transistor having two output terminals coupling between the input node and the intermediate node;
a third transistor having a control terminal coupling to the output node and having two output terminals coupling between the first node and the additional intermediate node; and
a fourth transistor having two output terminals coupling between an additional input node and the additional intermediate node, wherein:
the second and fourth transistors each have a control terminal;
the control terminal of the second transistor coupling to the first node; and
the control terminal of the fourth transistor coupling to the first node.

18. The device of claim 17, wherein the CMOS logic gate is a CMOS NAND or NOR gate.

19. The device of claim 17, wherein the second and fourth transistors are not connected in series.

20. The device of claim 17, wherein the additional input node is independent of the at least one input node.

* * * * *